United States Patent [19]

Dijkmans et al.

[11] 4,100,493
[45] Jul. 11, 1978

[54] TRANSMISSION SYSTEM FOR SIGNAL TRANSMISSION BY MEANS OF COMPRESSED DELTA MODULATION

[75] Inventors: Eise Carel Dijkmans; Karel Elbert Kuijk, both of Eindhoven, Netherlands

[73] Assignee: U.S. Philips Corporation, New York, N.Y.

[21] Appl. No.: 689,905

[22] Filed: May 25, 1976

[30] Foreign Application Priority Data

Jun. 5, 1975 [NL] Netherlands ............... 7506656

[51] Int. Cl.² ............................................. H03K 13/22
[52] U.S. Cl. ................................. 325/38 B; 332/11 D
[58] Field of Search ...................... 325/38 B; 332/11 D

[56] References Cited

U.S. PATENT DOCUMENTS 3,857,111 12/1974 Deschenes .................... 325/38 B

OTHER PUBLICATIONS

*Linear, Non-Linear, and Adaptive Delta Modulation,* Shindler, IEEE Transactions, vol. COM-22, No. 11, Nov. 1974, pp. 1807-1823.

*Primary Examiner*—Robert L. Griffin
*Assistant Examiner*—Michael A. Masinick
*Attorney, Agent, or Firm*—Frank R. Trifari; Henry I. Steckler

[57] ABSTRACT

Transmission system for signal transmission by means of compressed delta modulation provided with leaking integrators in the delta modulator and demodulator, the leaking integrator in the modulator being connected in series with the capacitor of large capacitance between the terminals of a signal source having controlled current sources for reducing the noise and distortion produced by the modulator.

2 Claims, 2 Drawing Figures

TRANSMISSION SYSTEM FOR SIGNAL TRANSMISSION BY MEANS OF COMPRESSED DELTA MODULATION

The invention relates to a transmission system for signal transmission by means of compressed delta modulation, comprising a transmitter and a receiver in which the transmitter comprises a delta modulator with compression control provided with a feedback circuit and the receiver comprises a delta demodulator with expansion control, whilst the delta demodulator and the feedback circuit of the delta modulator comprise identical controlled signal sources and identical parallel circuits of an integrating network and a leakage resistor, which circuits are coupled with output terminals of each of the signal sources.

Such a transmission system is known inter alia from FIG. 11 of the Article "Delta Modulation" by H. R. Schindler published in IEEE spectrum, October 1970, pages 67-70. Herein the leakage resistor applied in the delta demodulator in parallel with the integrating network has for its object to considerably reduce the influence of the faults introduced in the transmission path by noise signals in the transmitted signal, which causes inter alia an average number of "ones" and "zeros" in the demodulated signal which differs from zero.

For a transmission system it is a requirement that the transmission characteristics of the delta modulator and the delta demodulator are identical. This is realized by the fact that the parallel circuit of integrated network and leakage resistor applied in the delta modulator and demodulator are identical.

In given circumstances the quality of reproduction deteriorates in such a transmitter provided with a delta modulator with compression control, which has been explained at length in U.S. Pat. No. 3,831,092. This deterioration in the quality of reproduction is particularly produced at a low level of the signal to be transmitted, such as at levels from 30 dB below the nominal level. This deterioration is inter alia caused by leakage currents in and tolerances of the elements of the delta modulator.

To improve the quality of reproduction the suggestion is made in the above-mentioned U.S. patent to provide the delta modulator with an extra feedback loop. However, the transmission system realized in this manner is elaborate.

It is an object of the invention to improve the quality of reproduction in a transmission system of the type mentioned in the preamble in a very simple manner.

The transmission system according to the invention is therefore characterized in that the delta modulator comprises a series circuit of a capacitor and the parallel circuit of the integrating network and the leakage resistor connected between the terminals of the signal source and the controlled signal sources are provided with current sources for feeding current pulses to the parallel circuits of the integrating networks and the leakage resistors.

The invention and its advantages will be further explained with reference to the embodiments shown in the Figures, in which corresponding parts of the various Figures are designated by the same reference numerals and in which.

Figure 1:
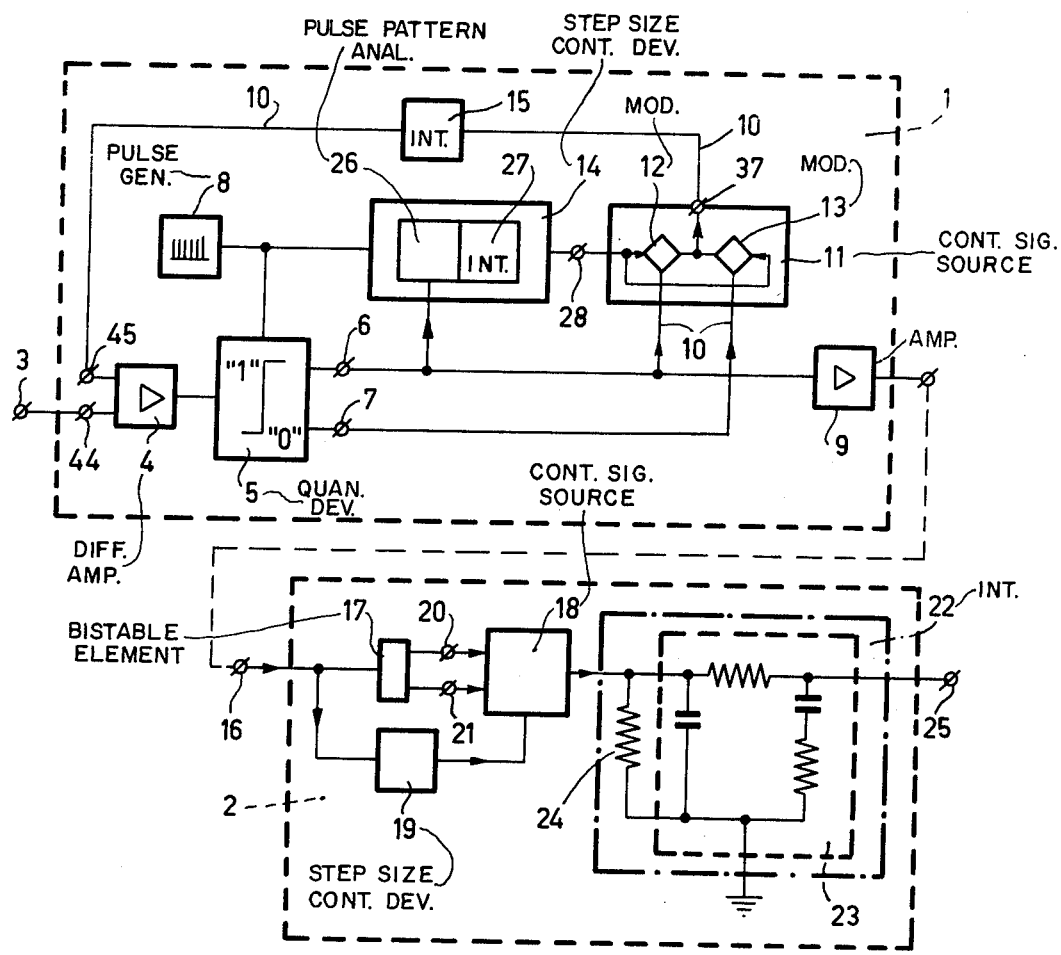
FIG. 1 shows an embodiment of a transmission system with non-uniform delta modulation.

The transmission system which is partly shown in FIG. 1 is arranged for converting in a transmitter an information signal into a delta modulated pulse series with controlled step-size, to transmit this delta modulated pulse series to a receiver associated with the transmitter and to convert in the receiver the delta modulated pulse series into the original information signal. For that purpose the transmitter comprises a delta modulator with compression control 1 and the receiver comprises a delta demodulator with expansion control 2.

Through an input terminal 3 the information signal is fed to a first input 44 of a difference amplifier 4, whose output is connected to the input of a quantizing device 5. This quantizing device 5 is constructed as a decision switch and comprises two outputs 6 and 7 at which mutually complementary digital signals are produced. This quantizing device 5 is controlled by sampling pulses supplied by a pulse generator 8. In known manner this quantizing device 5 supplies at its output 6 at the instant a sampling pulse occurs, a pulse having the binary valve "1", if the output signal at the difference amplifier 4 is positive and a pulse having the binary value "1" at its output 7 if the output signal of the difference amplifier 4 is negative.

Through an output amplifier 9 the output pulses occurring at the output 6 of the quantizing device 5 are transmitted to an associated receiver. In addition to being supplied to the output amplifier 9, the output pulses from output 6 are fed together with the output pulses of output 7 to a controlled signal source 11 which is included in a feedback loop 10. This controlled signal source 11 is constituted by two modulators 12 and 13 to which the output pulses are supplied which are produced at the outputs 6 and 7 respectively of the quantizing device 5. These modulators 12 and 13 are controlled by a step-size control device 14 connected to the output 6 of the quantizing device 5, which control device varies the energy contents of the output pulses of the quantizing device 5 which are supplied to the modulators 12 and 13 in proportion with the step-size produced by the step size control device 14. This varying may, for example, be effected by means of amplitude or duration modulation of these pulses fed to the modulators. The outputs of the modulators 12 and 13 are connected to an integrator 15 included in the feedback circuit 10, which integrator supplies a signal at its output which is fed to a second input 45 of the difference amplifier 4 to determine the output signal in known manner from the signals fed to the first and second input.

The pulses derived from the output amplifier 9 are transmitted to an input terminal 16 of a delta demodulator with expansion control 2 which is arranged in the receiver. The pulses applied to input terminal 16 are applied on the one hand through a bistable circuit 17 to a control signal source 18 which is identical with the signal source 11 in the transmitter, and on the other hand to a step-size control device 19 which is identical with the device 14 in the transmitter. The step-size control device 19 is also connected to a control input of the controlled signal source 18 to control this signal source. In known manner the bistable circuit supplies at the instant at which clock pulses occur which are produced from the received signals by a clock pulse regenerator, not shown in the Figure, a pulse having a binary value "1" at its output 20 if a pulse signal is present at input terminal 16 and a pulse having the binary value "1" at its output 21 if no pulse signal is present at input terminal 16. Otherwise the operation is fully identical with the control signal source 11 in the transmitter and the step-size control device 14 connected thereto.

The signals supplied by the controlled signal source 18 are applied to an integrator 22 which integrates these signals and which applies the signal thus obtained to an output terminal 25. In known manner the integrator 22 comprises in the embodiment shown here a double integrating network 23. A leakage resistor 24 is connected parallel with the integrating network 23, which resistor serves to eliminate in known manner by leakage of the integrated signal value, fault signals introduced on the transmission path, which are integrated by the integrating network 23. The integrator 22 has a first cut-off frequency of, for example, 200 Hz and a second cut-off frequency of, for example, 3400 Hz.

To obtain a transfer characteristic of the delta modulator 1 equal to the transfer characteristic of the delta demodulator 2 the integrator 15 in the delta modulator 1 is constructed in known transmission systems equal to the integrator 22 of the delta demodulator 2.

To explain the problems, the operation of the step-size control of the delta modulator will be elucidated hereinbelow.

When a pulse having the binary value "1" is produced at the output 6 of the quantizing device 5 the output voltage of the integrator 15 is increased, as described hereinbefore by an amount which is proportional to the step-size supplied by the stepsize control device 14, and when a pulse having the binary value "1" is produced at the output 7 of the quantizing device 5, the output voltage of the integrator 15 is decreased by an amount which is proportional to the step-size supplied by the step-size control device 14.

Producing said step-size by the step-size control device 14 may, for example, be done in the manner as described in the prior U.S. Pat. No. 3,729,678. More particularly, the step-size control device 14 comprises a pulse pattern analyser 26 which analyses the pulses produced at the output 6 of the quantizing device 5 and which supplies an output pulse each time predetermined pulse patterns are produced. Said pulse patterns are herewith formed by combinations of output pulses which are produced at the output 6 of the quantizing device 5 in the period which is equal to at least three periods of the pulse generator 8. Both the output pulses of the pulse generator 8 and the pulses produced at the output 6 of the quantizing device 5 are fed, in this embodiment, to the pulse pattern analyser 26. The output pulses of the pulse pattern analyser 26 are applied to an integrating network 27 whose output signal is a measure for said step-size. Through an output 28 this output signal is applied to the modulators 12 and 13 for controlling the energy contents of the pulses supplied by these modulators 12 and 13.

Owing to leakage currents and tolerances which, for example, occur in the elements of the difference amplifier 4, this difference amplifier 4 shows an output voltage which deviates from zero at equal input signals. As a result the quantizing device 5 supplies at one of its outputs 6 or 7 a plurality of pulses which so adjust the signal supplied by integrator 15 that the output signal of the difference amplifier is adjusted to zero.

Owing to the series of pulses supplied by the quantizing device 5, the step-size supplied by the step-size control device 14 has obtained a value which deviates from the smallest step-size. An information signal applied to the input terminal 3, and which has a very small amplitude, can no longer be accurately scanned by the delta modulator 1 owing to the step-size which has been adjusted to the above-mentioned value, so that in the transmission of signals having a small amplitude the quality decreases. This is obviated inter alia by providing the integrating network 27 with a finite storage time or by constructing the step-size analyser 26 thus that it readjusts the step-size to the smallest value in a predetermined manner etc.

However, the integrator 15 has been given a finite storage time to make the transfer characteristic of the delta modulator 1 equal to that of the delta demodulator 2. The DC voltage component stored in the integrator 15 will namely leak away through the leakage resistor included therein. This results in that the difference amplifier 4 will supply a DC voltage having an amplitude which deviates from zero, in response to which the quantizing device 5 supplies a pulse to re-install the DC voltage component at the integrator 15 through the controlled signal source 11. This results on the one hand in that this extra pulses produce noise in the transmitted delta modulated information signal, and on the other hand results in that the pulse pattern applied to the step-size control device 14 is changed, which causes distortion by the faulty step-sizes supplied by the step-size control device 14.

Figure 2:
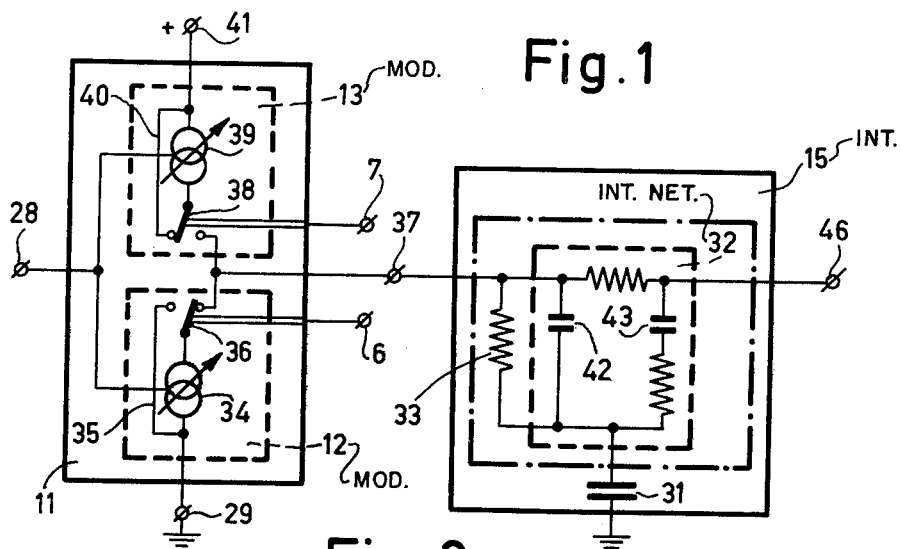
FIG. 2 shows an embodiment of a part of a modulator according to the invention for use in the embodiment shown in FIG. 1.

To compensate for this the delta modulator with compression control 1 is provided, as shown in FIG. 2, with a series circuit of a capacitor 31 and the parallel circuit of the integrating network 32 and the leakage resistor 33 connected between the terminal 29 or 41 and the terminal 37, and the controlled signal source 11 comprises current sources 34 and 39 for applying current pulses having an energy contents determined by the compression control to the said series circuit 31 to 33 inclusive.

The signal source 11 may be any known signal source provided with controlled current sources. A simple and integerable signal source which is particularly suitable for this purpose and which shows without the use of an additional control element only a very small deviation, which is within practically permissible limits, from a linear signal transmission as already described in U.S Patent application Ser. No. 639,576, filed Dec. 10, 1975 now U.S. Pat. No. 4,039,950.

FIG. 2 shows the circuit diagram of a signal source suitable for this purpose. This diagram shows a modulator 12 connected between the grounded terminal 29 and the input 37 of the integrating network 32 which modulator comprises the controlled current source 34 with parallel conductor 35 and a change-over switch 36. This diagram also shows the modulator 13 which is connected between the input terminal 37 and the terminal 41 which is connected to a positive terminal of a voltage source, not shown, which modulator comprises the change-over switch 38, the controlled current source 39 and the parallel conductor 40.

To control this signal source 11, the output 6 of the quantizing device 5 is connected to the control input of the change-over switch 36 for adjusting the change-over switch 36 to the position shown in the drawing under the control of a pulse occurring at output 6 and when no pulse is supplied to the position, not shown in the drawing. In the position as shown in the drawing the current source 34 applies a discharge pulse to the integrator 15 when a pulse occurs at output 6. In the position not shown in the drawing the current source 34 is disconnected from the integrating network 15 and shortcircuited via the parallel conductor 35. The output 7 of the quantizing device 5 is connected to the control input of the change-over switch 38 for adjusting the changeover switch 38 to the position not shown in the drawing under the control of a pulse occurring at the output 7. In this position the current source 39 supplies a charge pulse to the integrator 15 through input 37. If no pulse is present at output 7 the change-over switch 38 is adjusted to the position as shown in the drawing. In this position the current source 39 is disconnected from the integrator 15 and short-circuited through parallel conductor 40.

The output 28 of the step-size control device 14 is also connected to the two current sources for determining, under the control of the step-sizes supplied by the step-size control device 14 the energy contents of the current pulses supplied by the current sources 34 and 39.

An output voltage of the difference amplifier 4 which voltage deviates from zero at equal signals produces a series of pulses at the input terminals 44 and 45 in the manner already described. These pulses charge the capacitors 42 and 43 of the integrating network 32 and the capacitor 31 which is connected in series therewith. Through the leakage resistor 33 the charges at the capacitors 42 and 43 leak away whilst the charge at capacitor 31 is maintained. The output voltage of the difference amplifier 4 is adjusted to zero by the charge stored in the capacitor 31. Said charge leaks away only very slowly because the impedance of the controlled signal source 11 and the input impedance of the input 45 of the difference amplifier, which input is connected to the integrator 15 are very high. The number of correction pulses supplied by the quantizing device 5 to compensate for this leaking charge is consequently very small so that only very little extra noise is introduced in the output signal of the transmitter by the delta modulator inspite of the fact that for signals located in the speech band a so-called leaking integrator is used in the delta modulator. Also the number of faulty step-sizes and the signal distortion produced thereby is correspondingly reduced.

The transfer characteristic of the delta modulator 1 and delta demodulator 2 are identical within practically permissible limits if the capacitance of the capacitor 31 is large with respect to that of the capacitance used in the integrating network 32. For example, if the cut-off frequency of a second integrating network constituted by the capacitor 31 is at least a factor of 20 lower than said first cut-off frequency of the double integrating network 32, that is a cut-off frequency which is smaller than 10 Hz.

It should be noted that the behaviour of integrator 15, which is changed by the capacitor 31 with respect to that of integrator 22, can be compensated by adapting either the impedance of the integrating network 32 or the impedance of the integrating network 23 thereto.

From the above it follows that the integrating network 32 may also be a single integrating network.

What is claimed is:

1. A compressed delta modulation transmitter comprising a delta modulator, a feedback circuit comprising a controlled signal source coupled to said modulator, a first integrating network having a first terminal coupled to said controlled signal source, a second terminal coupled to said modulator, and a third terminal, a leakage resistor coupled between said first and third terminals of said integrating network, and a capacitor coupled to said integrating network third terminal and ground, said signal source comprising a pair of current source means for applying current pulses to said integrating network and said leakage resistor.

2. A transmitter as claimed in claim 1, further comprising a second integrating network including said capacitor, said first network having a cutoff frequency at least twenty times higher than the cutoff frequency of said second network.

* * * * *